(12) United States Patent
Silverbrook

(10) Patent No.: US 7,936,063 B2
(45) Date of Patent: ***May 3, 2011

(54) CARRIER ASSEMBLY FOR AN INTEGRATED CIRCUIT

(75) Inventor: Kia Silverbrook, Balmain (AU)

(73) Assignee: Silverbrook Research Pty Ltd, Balmain, New South Wales (AU)

( * ) Notice: Subject to any disclaimer, the term of this patent is extended or adjusted under 35 U.S.C. 154(b) by 0 days.

This patent is subject to a terminal disclaimer.

(21) Appl. No.: 12/765,690

(22) Filed: Apr. 22, 2010

(65) Prior Publication Data
US 2010/0202122 A1 Aug. 12, 2010

Related U.S. Application Data

(63) Continuation of application No. 12/276,390, filed on Nov. 23, 2008, now Pat. No. 7,705,452, which is a continuation of application No. 11/940,304, filed on Nov. 14, 2007, now Pat. No. 7,479,697, which is a continuation of application No. 11/758,644, filed on Jun. 5, 2007, now Pat. No. 7,307,354, which is a continuation of application No. 11/592,209, filed on Nov. 3, 2006, now Pat. No. 7,247,941, which is a continuation of application No. 10/902,852, filed on Aug. 2, 2004, now Pat. No. 7,154,172, which is a continuation of application No. 09/693,484, filed on Oct. 20, 2000, now Pat. No. 6,775,906.

(51) Int. Cl.
*H01L 23/48* (2006.01)

(52) U.S. Cl. ........ 257/730; 257/734; 257/773; 257/776; 257/E23.067; 257/E23.094; 439/80; 439/81; 439/84; 439/66; 361/760; 361/761; 361/764; 361/767; 361/789; 361/805

(58) Field of Classification Search .................. 257/730, 257/734, 773, 776, E23.067, E23.094
See application file for complete search history.

(56) References Cited

U.S. PATENT DOCUMENTS

| | | | |
|---|---|---|---|
| 3,723,176 A | 3/1973 | Theobald et al. | |
| 4,426,773 A | 1/1984 | Hargis | |
| 4,802,277 A | 2/1989 | Root | |
| 4,989,063 A | 1/1991 | Kolesar, Jr. et al. | |
| 5,045,921 A | 9/1991 | Lin et al. | |
| 5,173,055 A | 12/1992 | Grabbe | |
| 5,973,394 A | 10/1999 | Slocum et al. | |
| 6,028,358 A | 2/2000 | Suzuki et al. | |
| 6,078,505 A | 6/2000 | Tuiridic | |
| 6,114,763 A | 9/2000 | Smith | |
| 6,160,715 A | 12/2000 | Degani et al. | |
| 6,285,086 B1 | 9/2001 | Sota et al. | |
| 6,365,967 B1 | 4/2002 | Akram et al. | |
| 6,396,143 B1 | 5/2002 | Kimbara et al. | |
| 6,524,115 B1 | 2/2003 | Gates et al. | |
| 6,568,073 B1 | 5/2003 | Fukutomi et al. | |

(Continued)

FOREIGN PATENT DOCUMENTS

EP 0658927 A 6/1995

(Continued)

*Primary Examiner* — Jasmine J Clark

(57) ABSTRACT

A carrier assembly for an integrated circuit is disclosed. The carrier assembly has a retainer with electrical contacts for receiving the integrated circuit, and island defining portions arranged about the retainer. Each island defining portion is connected to neighboring island defining portions through a serpentine member. This connection allows resilient deflection between the island defining portions.

8 Claims, 11 Drawing Sheets

U.S. PATENT DOCUMENTS

| | | |
|---|---|---|
| 6,775,906 B1 | 8/2004 | Silverbrook |
| 6,946,743 B2 | 9/2005 | Silverbrook |
| 7,154,172 B2 | 12/2006 | Silverbrook |
| 7,479,697 B2 | 1/2009 | Silverbrook |
| 7,705,452 B2 * | 4/2010 | Silverbrook ................. 257/730 |

FOREIGN PATENT DOCUMENTS

| | | |
|---|---|---|
| EP | 0852397 A | 7/1998 |
| GB | 2349014 A | 10/2000 |
| JP | 61-069150 | 4/1986 |
| JP | 61-206251 | 9/1986 |
| JP | 01-144652 | 6/1989 |
| JP | 04-313232 | 11/1992 |
| JP | 09-045809 | 2/1997 |
| JP | 09-289299 | 11/1997 |
| JP | 10-224010 | 8/1998 |
| JP | 11-284029 A | 10/1999 |
| JP | 11345826 A | 12/1999 |
| JP | 2000-012732 | 1/2000 |
| JP | 2001-094228 A | 4/2001 |
| WO | WO 99/59206 | 5/2002 |

* cited by examiner

CARRIER ASSEMBLY FOR AN INTEGRATED CIRCUIT

CROSS-REFERENCE TO RELATED APPLICATION

The present application is a Continuation Application of U.S. application Ser. No. 12/276,390 filed on Nov. 23, 2008, which is a Continuation Application of U.S. application Ser. No. 11/940,304 filed on Nov. 14, 2007, now issued as U.S. Pat. No. 7,479,697, which is a Continuation Application of U.S. application Ser. No. 11/758,644 filed on Jun. 5, 2007, now issued as U.S. Pat. No. 7,307,354, which is a Continuation Application of U.S. application Ser. No. 11/592,209 filed on Nov. 3, 2006, now issued as U.S. Pat. No. 7,247,941, which is a Continuation Application of U.S. application Ser. No. 10/902,852, filed on Aug. 2, 2004, now issued as U.S. Pat. No. 7,154,172, which is a Continuation Application of U.S. application Ser. No. 09/693,484, filed on Oct. 20, 2000, now issued U.S. Pat. No. 6,775,906 all of which are herein incorporated by reference.

FIELD OF THE INVENTION

This invention relates to integrated circuit packages. More particularly, the invention relates to a method of manufacturing an integrated circuit carrier for an integrated circuit package.

BACKGROUND TO THE INVENTION

Due to the ever-increasing number of connections (pin-count) of integrated circuits, the use of ball grid array packages to connect integrated circuits to printed circuit boards is increasing. This facilitates the redistribution of a very fine pitch of flip-chip bump array of the integrated circuit to a much larger pitch ball grid array for attachment to the printed circuit board (PCB).

The carrier is often referred to as an interposer and can be fabricated from different materials such as ceramic, or a plastics material such as bismaleimide triazine (BT).

The carrier also functions as a heat sink by removing thermal energy from the integrated circuit by thermal conduction. Accordingly, the carrier is subjected to thermal strains.

In addition, an electronic package assembly comprising the integrated circuit, the carrier and the PCB has a number of different materials with different mechanical properties. Complex thermal stresses can occur inside the package during operation due to non-uniform temperature distributions, geometry, material construction and thermal expansion mismatches.

Typically, these days the integrated circuit is electrically connected to the carrier by a ball grid array of gold or solder bumps. Similarly, the carrier is electrically connected to the PCB by a further, larger ball grid array of solder balls. The thermo-mechanical stresses are typically severest at the solder ball interfaces between the PCB and the carrier. This can result in shearing of the solder ball connection. The problem is amplified by an increase in edge length of the carrier because of an increase in the thermal strain differences between the PCB and the carrier. An increase in edge length of the carrier is typically associated with an increase in the number of integrated circuit connections and solder balls.

Current ball grid array design is, presently, at the limit of reliability for typical integrated circuit pin counts.

Typically, a solder ball has a peak elastic shear strain value of around 0.08%. Computational experiments done by the applicant using a 500 micron thick solid Silicon carrier, 500 micron diameter solder balls at 1 millimeter pitch, a 700 micron thick PCB and a 16 millimeter side silicon chip indicated a peak shear strain value of 1.476% in the outermost ball of the package which is far above the plastic yield value of the solder ball.

This result is to be expected as the balls at the outermost edge of the package experience the greatest amount of translational shear.

As indicated in the publication of the Assembly and Packaging Section of the International Technology Road Map for Semiconductors,—1999 Edition (copy attached), the most recent edition available at the time of filing the present application, in Table 59a at page 217, a pin count of a high performance integrated circuit has of the order of 1800 pins. The technology requirements in the near term, i.e. until the year 2005 indicate that, for high performance integrated circuits, a pin count exceeding 3,000 will be required for which, as the table indicates, there is, to date, no known solution. Similarly, in Table 59b of that publication, at page 219, in the longer term, until approximately the year 2014, a pin count for high performance integrated circuit packages of the order of 9,000 will be required. Again, as indicated in the table, there is no known solution for this type of package. These aspects are the focus of the present invention.

SUMMARY OF THE INVENTION

According to an aspect of the invention there is provided a carrier assembly for an integrated circuit, said assembly comprising:

a retainer including electrical contacts for receiving the integrated circuit; and island defining portions arranged about the retainer, each island defining portion being connected to neighboring island defining portions through a serpentine member, thereby allowing resilient deflection between the island defining portions.

Other aspects are also disclosed.

BRIEF DESCRIPTION OF THE DRAWINGS

The invention is now described by way of example with reference to the accompanying diagrammatic drawings in which:—

DETAILED DESCRIPTION OF THE DRAWINGS

Figure 2:
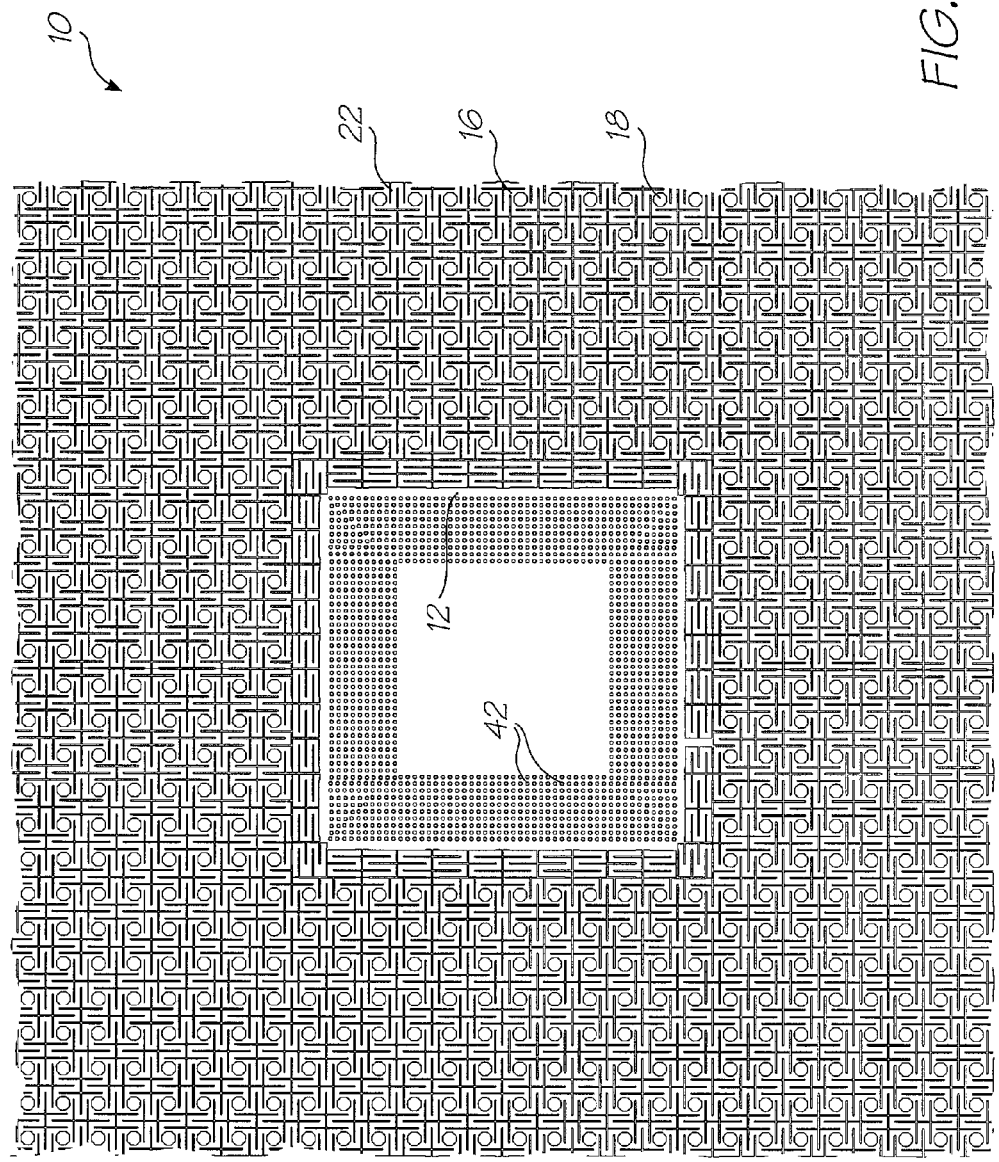
FIG. 2 shows a plan view of a part of an integrated circuit carrier, in accordance with the invention.

Referring to the drawings, an integrated circuit carrier, in accordance with the invention, is designated generally by the reference numeral 10. An integrated circuit carrier is shown in greater detail in FIG. 2 of the drawings.

Figure 7:
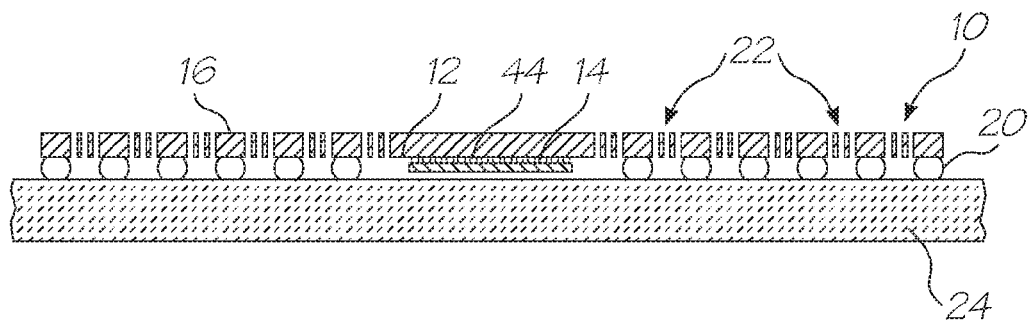
FIG. 7 shows a sectional, side view of one embodiment of the integrated circuit carrier, in use.

The integrated circuit carrier 10 has a receiving zone 12 for receiving an integrated circuit or chip 14 (FIG. 7).

A plurality of island defining portions or islands 16 surround the receiving zone 12. Each island 16 has an electrical terminal 18 thereon to which a solder ball 20 is attach or reflowed.

Figure 1:
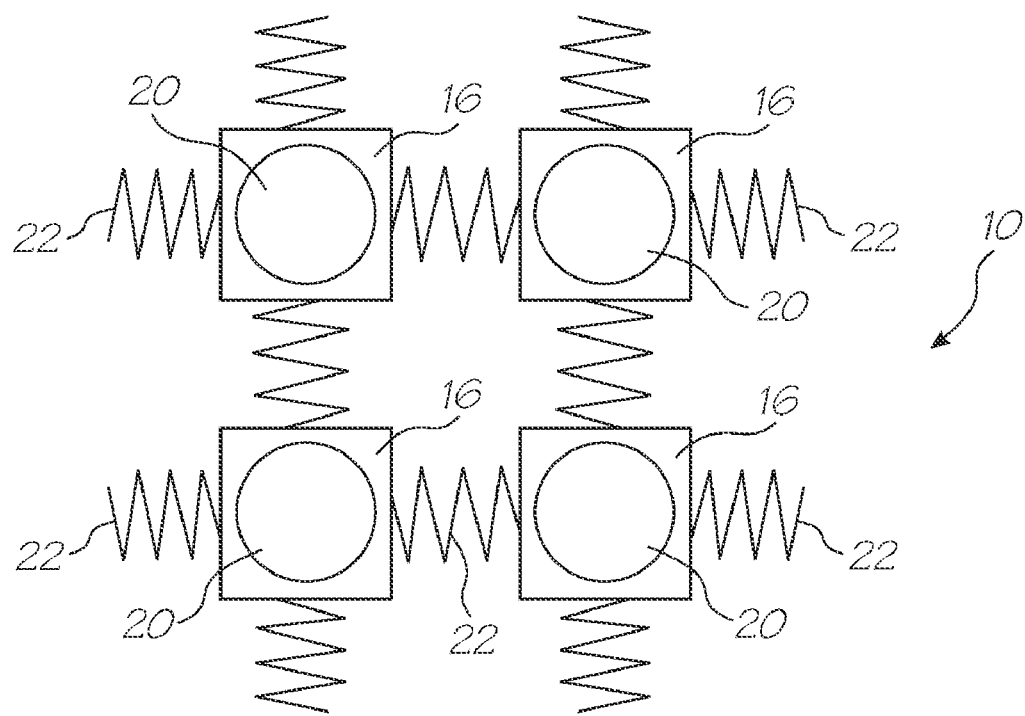
FIG. 1 shows a schematic, plan view of part of a conceptual integrated circuit carrier.

Each island 16 is connected to its neighboring island or islands 16 via a rigidity reducing arrangement in the form of a serpentine member 22. This is shown in greater detail conceptually in FIG. 1 of the drawings. As illustrated in FIG. 1, each serpentine member 22 serves a spring-like function so that each island 16 has a degree of freedom of movement relative to its neighboring islands 16. Accordingly, the difference in expansion between a printed circuit board 24 (FIGS. 7 to 9) and the carrier 10 is compensated for by extension or retraction of the relevant serpentine members 22. As a result, the shear strain imparted to the solder balls 20 on the island 16 is considerably reduced and fatigue failure of the solder balls 20 is, correspondingly, reduced.

Figure 3:
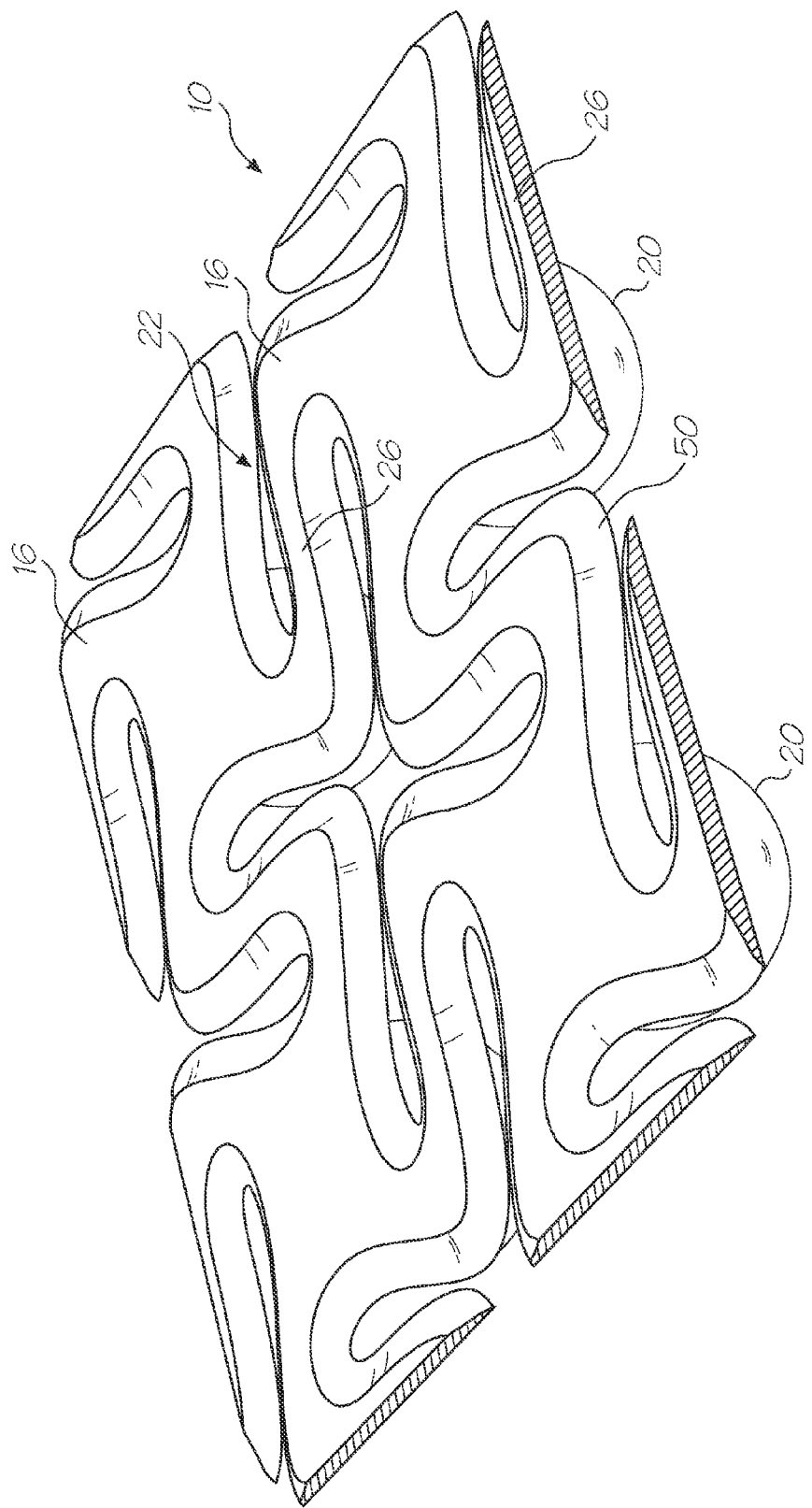
FIG. 3 shows a perspective, sectional view of part of one embodiment of the to integrated circuit carrier.

Various embodiments of the carrier 10 are now described with reference to FIGS. 3 to 6 of the drawings. In FIG. 3 of the drawings, the carrier 10 has each island 16 connected to its neighboring island 16 by a serpentine member 22 which has a single, curved arm 26.

Figure 4:
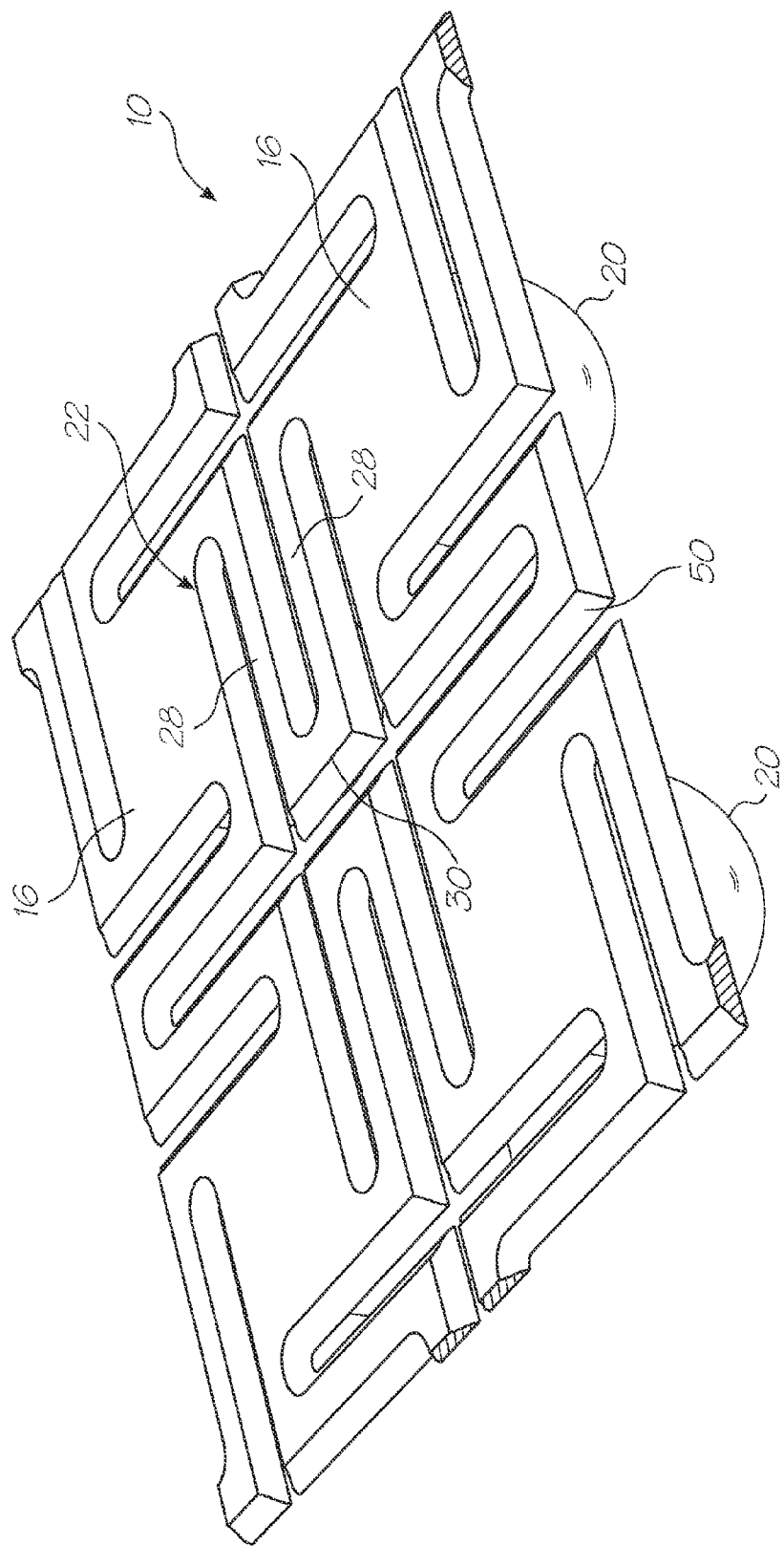
FIG. 4 shows a perspective, sectional view of part of a second embodiment of the integrated circuit carrier.
Figure 5:
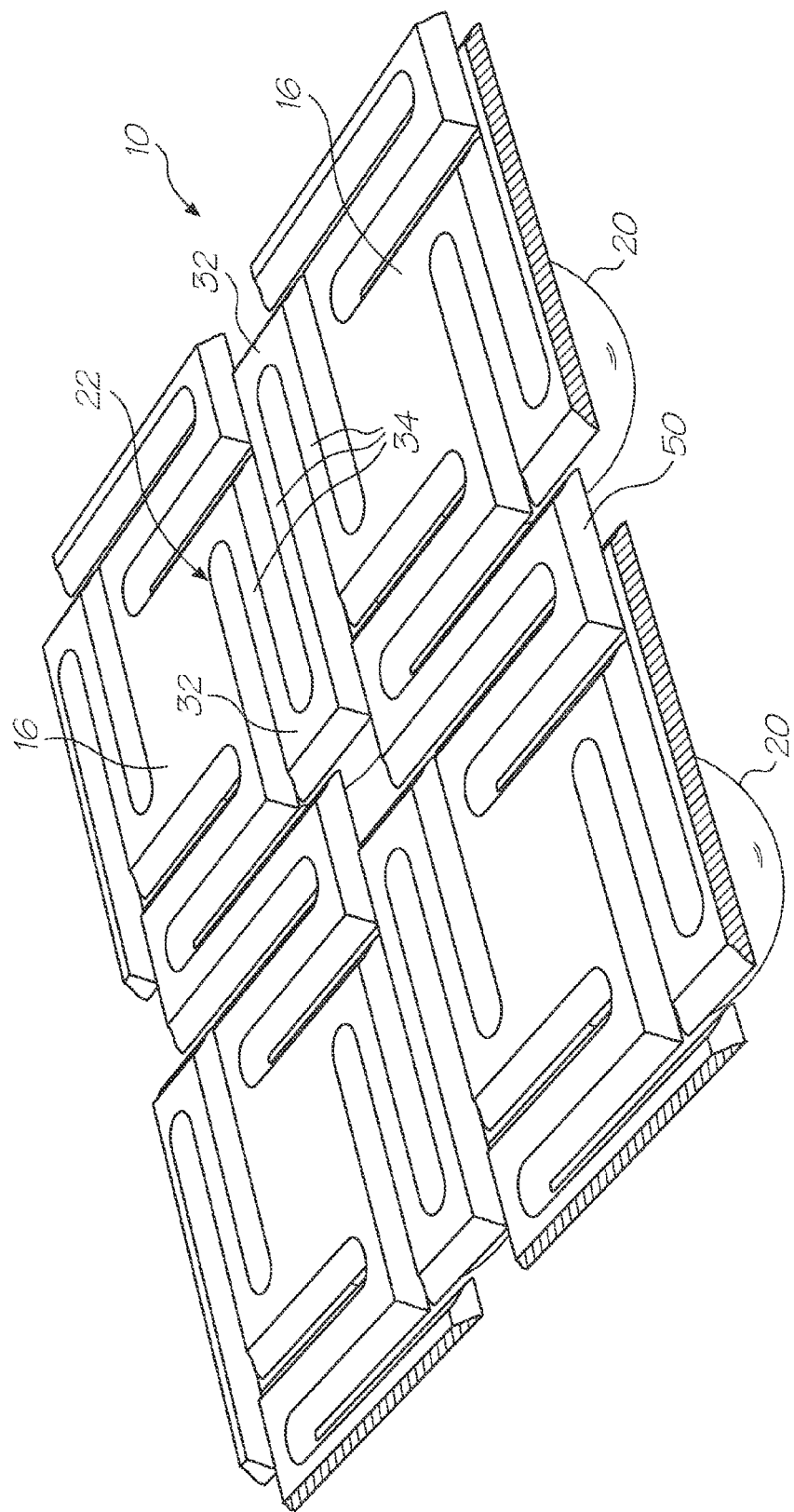
FIG. 5 shows a perspective, sectional view of part of a third embodiment of the integrated circuit carrier.

In the embodiment of the invention shown in FIG. 4 of the drawings, each serpentine member 22 connects one island 16 to its neighboring island 16 by a pair of parallel arms 28 interconnected by an orthogonal bridging portion 30. Each serpentine member 22 of the embodiment illustrated in FIG. 5 of the drawings connects one island 16 to its neighboring island 16 via an arrangement having three arms 34 extending parallel to each other. Adjacent arms 34 are connected together by an orthogonal bridging portion 32.

Figure 6:
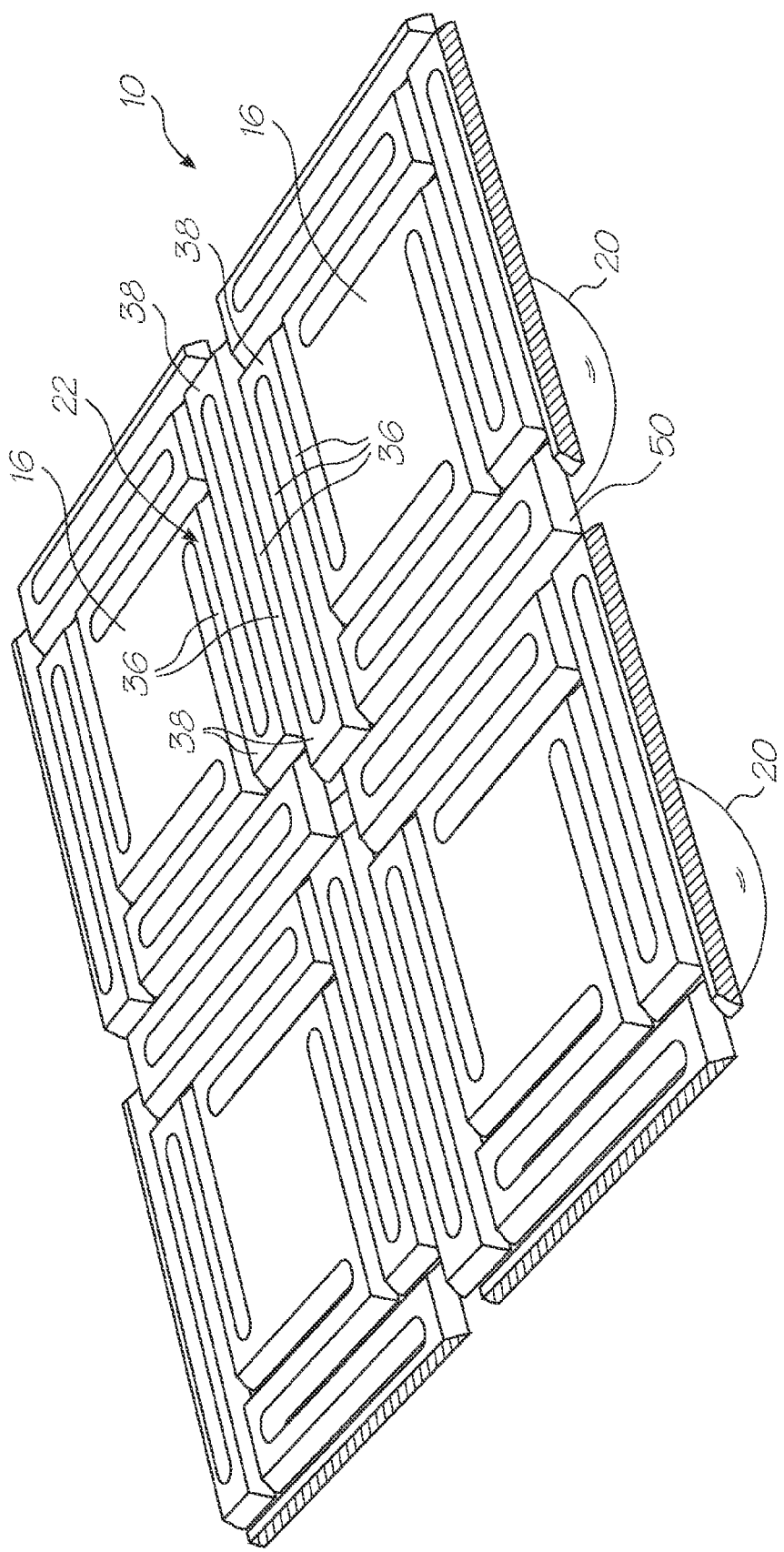
FIG. 6 shows a perspective, sectional view of part of a fourth embodiment of the integrated circuit carrier.

In the embodiment illustrated in FIG. 6 of the drawings, each serpentine member 22 which connects one island 16 to its neighboring island 16 has five parallel arms 36 with adjacent arms 36 being connected by an orthogonal bridging portion 38.

For ease of explanation, the embodiments illustrated in FIGS. 3 to 6 of the drawings shall be referred to below as the one arm 26 serpentine member 22, the two arm 28 serpentine member 22, the three arm 34 serpentine member 22, and the five arm 36 serpentine member 22, respectively.

Figure 8:
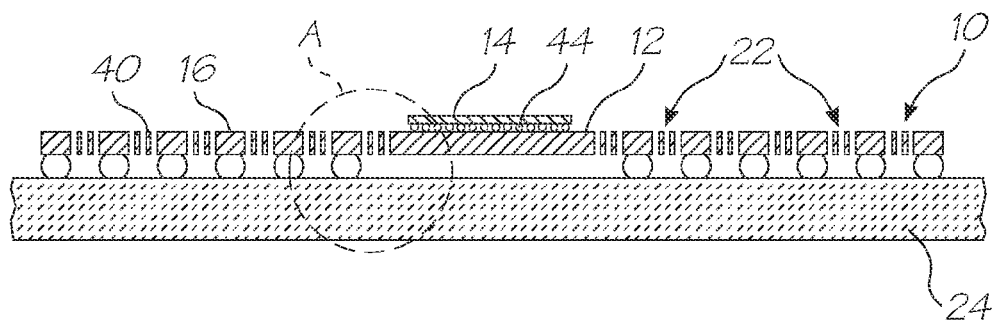
FIG. 8 shows a sectional, side view of another embodiment of the integrated circuit carrier, in use.
Figure 9:
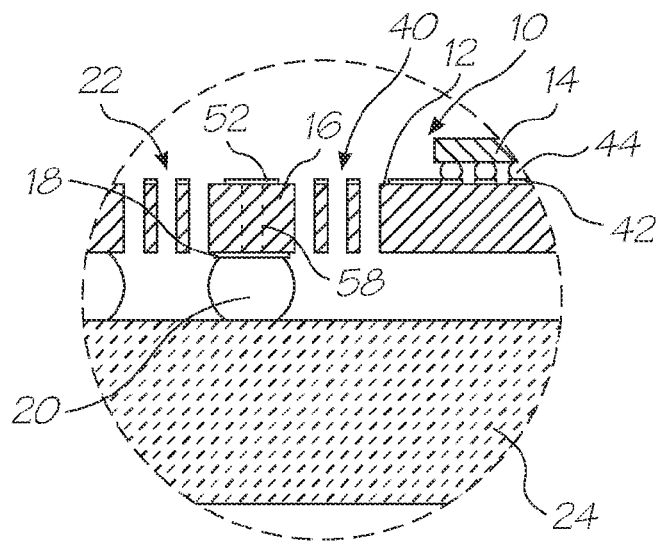
FIG. 9 shows, on an enlarged scale, the circled part 'A', of FIG. 8.

As illustrated more clearly in FIGS. 7 to 9 of the drawings, those islands 16 surrounding the receiving zone 12 are connected to the receiving zone by a second rigidity reducing arrangement in the form of a zigzag element 40 which further aids in reducing the strain imparted to the solder balls 20.

Also, as illustrated in FIGS. 7 to 9 of the drawings, the integrated circuit 14 is electrically connected to electrical contacts 42 (FIG. 2) in the receiving zone 12 via solder bumps 44.

The carrier 10 is formed from the same material as the integrated circuit 14. Accordingly, the carrier 10 is formed of silicon having an insulating layer of silicon dioxide. The insulating layer 54 also serves as a hard mask for etching the serpentine members 22, as will be discussed in greater detail below.

In the manufacture of the integrated circuit carrier 10, a wafer 46 of silicon is provided. The wafer 46 can be single crystal silicon or polycrystalline silicon.

Figure 10:
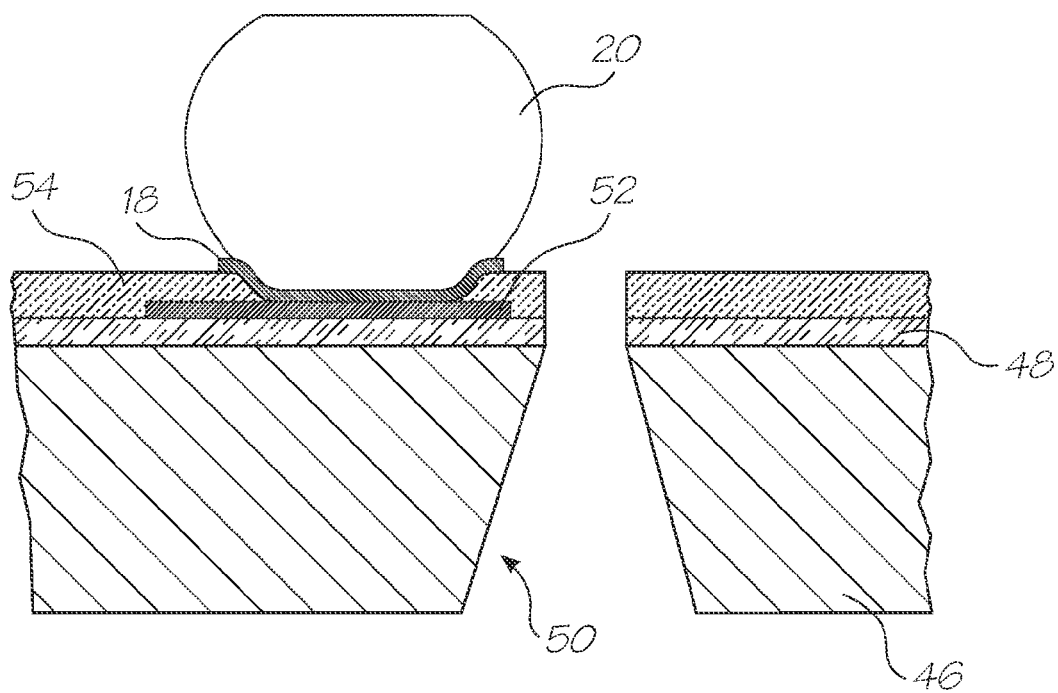
FIG. 10 shows, on an even greater enlarged scale, a sectional side view of part of the integrated circuit carrier.

It is to be noted that the version of the carrier 10 shown in FIG. 10 of the drawings is where the receiving zone 12 is on the same side of the carrier 10 as the pads 18 as shown in FIG. 7 of the drawings. Where the receiving zone 12 is on an opposite surface of the carrier 10, as shown in FIG. 8 of the drawings, the circuitry layer 48 is applied to both sides of the wafer 46. This is shown on a smaller scale in FIG. 9 of the drawings. In this embodiment, each track 52 is electrically connected to its associated pad 18 via a plated through hole 58 extending through the wafer 46.

Figure 11:
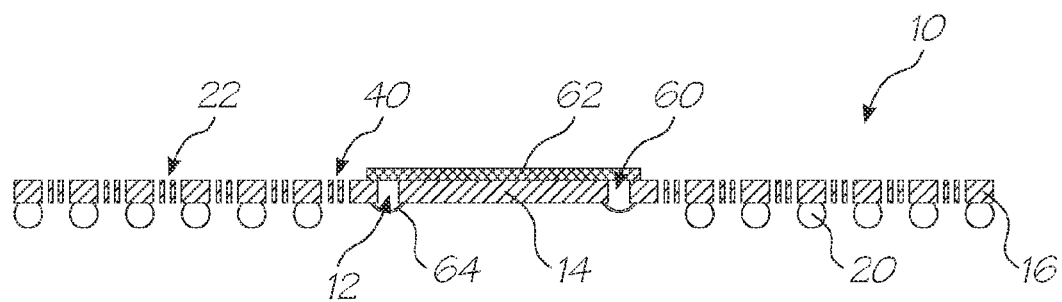
FIG. 11 shows a side view of yet a further embodiment of the integrated circuit carrier.
Figure 12:
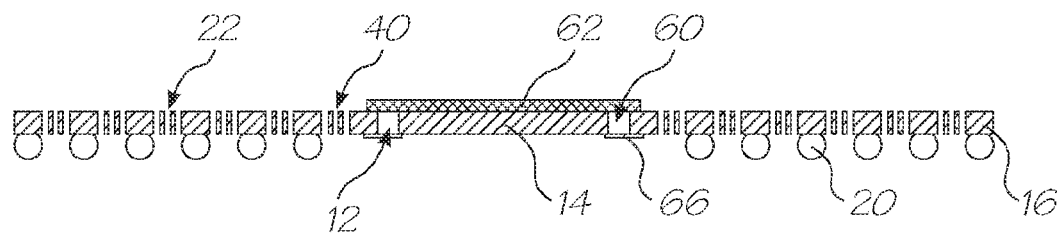
FIG. 12 shows a sectional side view of still a further embodiment of the integrated circuit carrier.

Referring now to FIGS. 11 and 12 of the drawings, two further embodiments of the carrier 10 are illustrated. With reference to the previous drawings, like reference numerals refer to like parts, unless otherwise specified.

In the examples illustrated, the receiving zone 12 is, instead of being demarcated on a surface of the carrier 10, a passage 60 defined through the carrier 10. The integrated circuit 14 is attached to a mounting means or retaining means in the form of a metallic lid 62 which is bonded to one surface of the carrier 10. An opposed surface of the integrated circuit 14 has bond pads for electrically connecting the integrated circuit to the carrier 10. It will be appreciated that, in this embodiment, the electrical contacts are arranged on that part of the carrier 10 surrounding the passage 60. In the embodiment illustrated in FIG. 11 of the drawings, the interconnects are wire bonds 64. Either ball or wedge bonds can be used. In the embodiment illustrated in FIG. 12 of the drawings, the interconnects are tape automated bond (TAB) films 66 or other planar connections such as beam leads.

Figure 13:
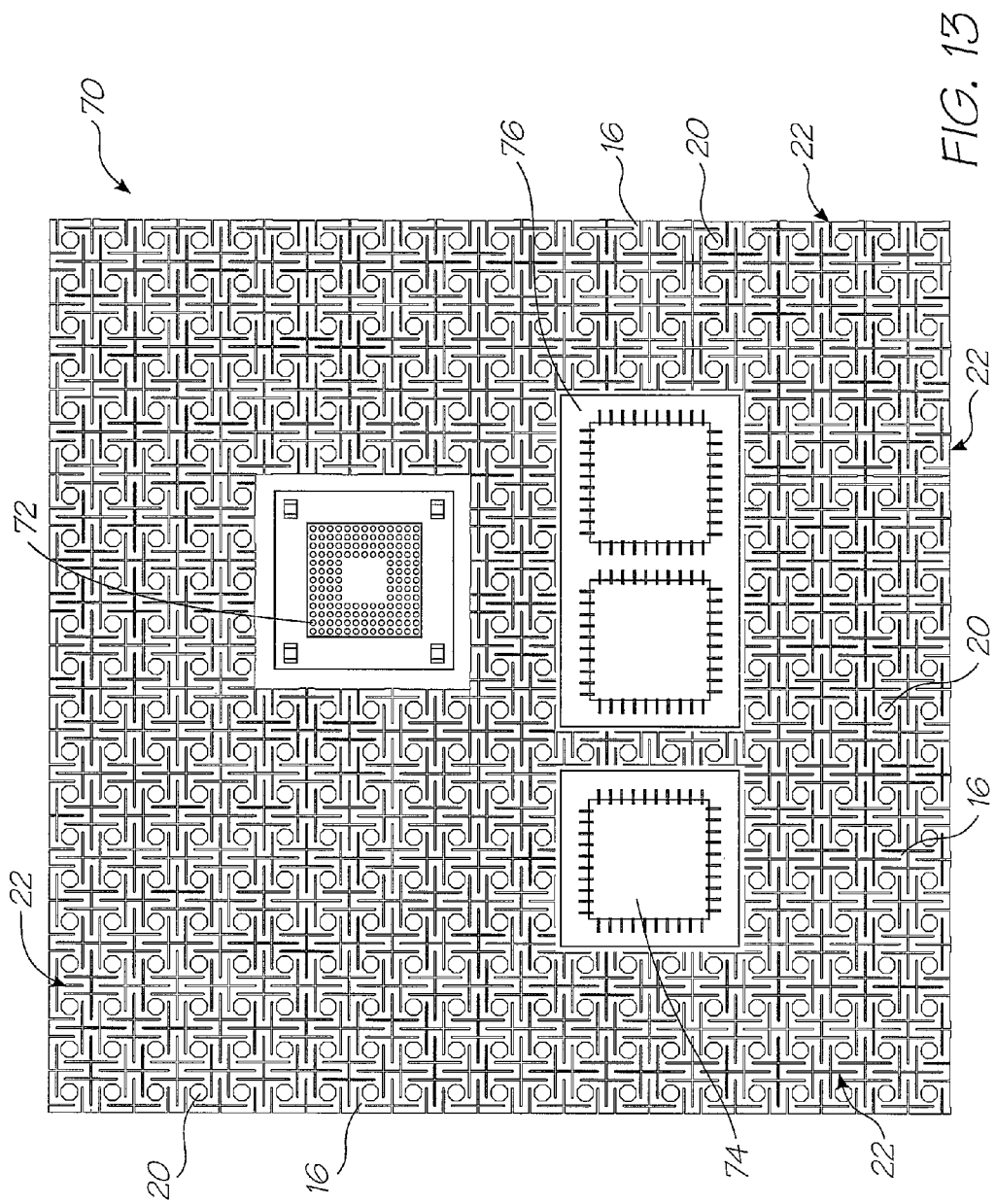
FIG. 13 shows a multi-chip module based on the integrated circuit carrier.

Referring now to FIG. 13 of the drawings, a development of the integrated circuit carrier is illustrated and is designated generally by the reference numeral 70. With reference to the previous drawings, like reference numerals refer to like parts, unless otherwise specified.

Figure 14:
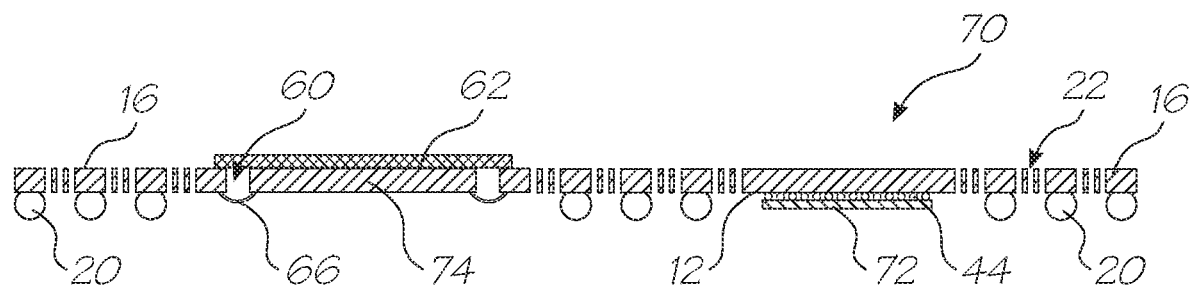
FIG. 14 shows a sectional side view of the multi-chip module based on the integrated circuit carrier.

In this embodiment of the invention, the carrier 70 is a multi-chip module substrate 70 carrying a plurality of integrated circuits or chips such as those illustrated at 72, 74 and 76 in FIG. 13. The chips 72, 74 and 76 are either carried on the surface of the carrier 70 or, as described above with reference to FIGS. 10 and 11, the chips are recessed in the carrier 70 as illustrated in FIG. 14 of the drawings.

As indicated above, the serpentine members 22 may have different configurations such as the one arm 26 configuration, the two arm 28 configuration, the three arm 34 configuration or the five arm 36 configuration. Other configurations such as 4 arm or 6 or more arm configurations are also possible using finite element analyses, a results matrix for different carrier implementations, having different forms of serpentine members 22 and different ball arrays was generated. The matrix, which is set out below, contains results for ball grid arrays having rows of one to twenty-four balls, carriers of solid silicon, solid $Al_2O_3$, solid BT, a one arm 26 serpentine member 22, a two arm 28 serpentine member 22, a three arm 34 serpentine member 22 and a five arm 36 serpentine member.

| | No. of Balls in Row | | | | | |
|---|---|---|---|---|---|---|
| | 1 | 4 | 8 | 16 | 24 | 100 |
| Solid Si Interposer | | | 1.08% | 1.48% | 1.61% | 1.01% |

-continued

|  | No. of Balls in Row | | | | | |
| --- | --- | --- | --- | --- | --- | --- |
|  | 1 | 4 | 8 | 16 | 24 | 100 |
| Solid Al$_2$O$_3$ Interposer |  |  | 0.667% | 0.953% | 1.077% | 0.72% |
| Solid BT Interposer |  |  | 0.126% | 0.149% | 0.150% | 0.097% |
| One arm serpentine member |  |  | 0.103% | 0.0903% | 0.085% |  |
| Two arm serpentine member | 0.47% | 0.15% | 0.147% | 0.136% | 0.128% | 0.088% |
| Three arm serpentine member | 0.22% | 0.082% | 0.079% | 0.058% | 0.056% |  |
| Five arm serpentine member |  |  | 0.025% | 0.025% | 0.013% |  |

As indicated above, the elastic strain limit for solder is around 0.08%. A row of solder balls is defined as from an edge of the receiving zone 12 to the edge of the carrier 10.

The results show that the peak solder ball strain value for solid carriers increases with an increasing number of solder balls 20 up to a certain point, due to the cumulative effect of thermo-mechanical strain between the PCB 24 and carrier 10. The solder ball strain actually goes down for the hundred ball implementation, probably due to a change in deflection shape of the solid silicon carrier. Peak strain still occurs in the outermost ball however although it is decreased because differential expansion between the carrier and the PCB is minimised. Also, the peak strain value of the solid carriers, apart from the BT carrier, is still, far in excess of the elastic strain limit for solder.

The serpentine member 22 implementations show a decrease in peak solder ball strain with increasing number of solder balls. This is due to the fact that the thermal strain mismatch is distributed over a greater number of solder balls 20 resulting in a deflected shape with less severe gradients. Smaller ball grid arrays, i.e. having fewer balls in a row, exhibit more severe deflection gradients that induce a concentrated load on either the innermost or the outermost solder ball 20.

Accordingly, it is a particular advantage of the invention that, due to the reduction of the peak strain with an increasing number of solder balls 20 there is no thermo-mechanical limit to the amount of integrated circuit pin connections. A line of 100 balls on all sides of the receiving zone 12 equates to a ball grid array of more than 40,000 balls, well in excess of expected requirements of 9,000 balls by 2014. Finite element calculations indicate that the peak solder ball strain is less than the elastic limit of solder for carriers with three or more arm serpentine members, with 8 or more rows of balls. As the receiving zone is silicon, and therefore has the same coefficient of thermal expansion as a silicon integrated circuit, the strain on the bump connections from the integrated circuit 14 to the carrier 10 is minimised. This indicates that a silicon BGA with etched compliant regions as described herein can provide a definite solution to problems of failure from thermal cycling that currently limit the number of connections that can be made between a chip and a PCB using ball grid arrays. Also, as described above, with the provision of the serpentine members 22, a greater surface area is provided which is further enhanced by the re-entrant etch 50 such that the heat sink capability of the carrier 10 is enhanced. This also aids in the increase in the number of solder balls 20 which can constitute the array.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

The invention claimed is:

1. A carrier assembly for an integrated circuit, said assembly comprising:
    a retainer including electrical contacts for receiving the integrated circuit; and
    island defining portions arranged about the retainer, each island defining portion being connected to neighboring island defining portions through a serpentine member, thereby allowing resilient deflection between the island defining portions.

2. The carrier assembly of claim 1, wherein one or more of the island defining portions have electrical terminals for connecting to an underlying printed circuit board.

3. The carrier assembly of claim 2, wherein one or more of the electrical terminals connect to the printed circuit board through solder balls.

4. The carrier assembly of claim 1, wherein each serpentine member comprises one or more curved arms.

5. The carrier assembly of claim 1, wherein island defining portions are connected to the retainer through elements having a zigzag configuration.

6. The carrier assembly of claim 1 formed from a material having a co-efficient of thermal expansion approximating that of the integrated circuit.

7. The carrier assembly of claim 1 further having an insulation layer formed from silicon dioxide.

8. The carrier assembly of claim 1, wherein the serpentine member comprises a plurality of curved arms interconnected by one or more orthogonal bridging portions.

* * * * *